(12) United States Patent
Lee et al.

(10) Patent No.: US 10,069,275 B1
(45) Date of Patent: Sep. 4, 2018

(54) BEAM PROJECTOR MODULE USING LASER

(71) Applicant: Namuga Co., Ltd., Seongnam-si, Hyeonggi-do (KR)

(72) Inventors: Jun Youb Lee, Seongnam-si (KR); Young Gyu Kang, Yongin-si (KR); Jeong Hwa Seo, Seongnam-si (KR)

(73) Assignee: Namuga Co., Ltd. (KR)

( * ) Notice: Subject to any disclaimer, the term of this patent is extended or adjusted under 35 U.S.C. 154(b) by 0 days.

(21) Appl. No.: 15/821,090

(22) Filed: Nov. 22, 2017

(30) Foreign Application Priority Data

Oct. 26, 2017 (KR) ......................... 10-2017-0140518

(51) Int. Cl.
*H01S 5/06* (2006.01)
*H01S 5/062* (2006.01)
*H01S 5/022* (2006.01)

(52) U.S. Cl.
CPC .......... *H01S 5/062* (2013.01); *H01S 5/02276* (2013.01); *H01S 5/02296* (2013.01)

(58) Field of Classification Search
CPC .. H01S 5/022; H01S 5/02208; H01S 5/02236; H01S 5/02256; H01S 5/02276; H01S 5/02288; H01S 5/02296; H01S 5/062
See application file for complete search history.

(56) References Cited

U.S. PATENT DOCUMENTS

2016/0268344 A1* 9/2016 Lin ...................... H01L 27/2463
2017/0353004 A1* 12/2017 Chen ................... H01S 5/02288

FOREIGN PATENT DOCUMENTS

| JP | 2004-525390 A | 8/2004 |
| JP | 2004-341210 A | 12/2004 |
| JP | 2009-043766 A | 2/2009 |
| JP | 2009-044033 A | 2/2009 |
| KR | 10-0648929 B1 | 11/2006 |
| KR | 10-2008-0007217 A | 1/2008 |

* cited by examiner

*Primary Examiner* — Armando Rodriguez
(74) *Attorney, Agent, or Firm* — Harness, Dickey & Pierce, P.L.C.

(57) ABSTRACT

The present disclosure provides a beam projector module including: a PCB on which a cathode wire and an anode wire are positioned; a conductive pad that is made of a conductive material or coated with a conductive material and has one side surface; a first frame that is made of a non-conductive material and has one side surface which is in contact with the PCB; a light source having a cathode electrode and an anode electrode, the cathode electrode being in contact with the other side surface of the conductive pad; the anode electrode being connected to the anode wire through at least one electric wire passing through the opening; a diffuser configured to diffuse a light beam output from the light source; and a second frame configured to support the diffuser so that the diffuser is spaced from the light source by a predetermined distance.

11 Claims, 6 Drawing Sheets

BEAM PROJECTOR MODULE USING LASER

CROSS REFERENCE TO RELATED APPLICATION

This application claims priority from Korean Patent Application No. 10-2017-0140518, filed on Oct. 26, 2017, which is hereby incorporated by reference for all purposes as if fully set forth herein.

BACKGROUND OF THE INVENTION

1. Field of the Invention

The present disclosure relates to a beam projector module.

2. Description of the Prior Art

A laser is an abbreviation for "Light Amplification by Stimulated Emission of Radiation" and can output collimated and condensed beams of light. Further, lasers have monochromacity and directionality and are thus variously utilized in the optical sensor technical field.

For example, a laser can be utilized as a light source of a distance measuring device and as a light source of a three-dimensional depth camera (3D Depth Camera). A Time of Flight (ToF)-type distance measuring device can measure, through a phase difference, a movement distance which a pulsed light wave travels while the wave is output from a light source, is reflected by an object, and then returns the light source, and can measure a distance through such a phase difference and frequency information. A structure light (SL)- or hybrid stereo-type distance measuring device can extract distance information by using a laser light source as a source to form a regular or irregular pattern through a diffuser.

The laser has a high output and directionality and is thus utilized as a light source of a distance measuring device and a 3D Depth Camera.

Meanwhile, a high output of the laser may be recognized as an advantageous property in that the high output thereof can increase the flight distance of a light beam and can maintain the output of a returned light beam at a predetermined level or higher, but may be recognized as a disadvantageous property in terms of safety. Direct irradiation of a high-output light beam to an eyeball may cause damage to the eyeball and may even cause blindness. Therefore, when a laser is used as a light source, safety problems should be always considered.

In general, nations have their own eyesafety standards and thus control the intensity of a light beam output from a device to have a value equal to or lower than a reference value.

One of methods for controlling the intensity of an output light beam is to dispose a diffuser, which can reduce the intensity of a light beam, on an output path of the light beam. The diffuser diffuses a collimated light beam into a certain field of view, as required by the system, by using the effect of refraction and diffraction based on properties of light. Thus, the intensity of a light beam, which has passed through the diffuser, decreases per unit area.

However, in a device for controlling the intensity of a light beam by using a diffuser as described above, when the diffuser is detached, a high-output light beam is output as it is and thus may cause safety problems.

SUMMARY OF THE INVENTION

In the context of the described background, an aspect of the present disclosure is to provide a technology for a beam projector module having a new structure.

The beam projector module having a new structure can provide an eye-safety function, have a reduced manufacturing cost, or reduce power loss.

In accordance with an aspect of the present disclosure, there is provided a beam projector module including: a cathode conductive pad that is made of a conductive material or coated with a conductive material and has one side surface, a part or the entirety of which is in contact with a cathode wire on a Printed Circuit Board (PCB) for supplying power; a first frame that is made of a non-conductive material and has one side surface which is in contact with the PCB, an opening being formed on an anode wire of the PCB; a light source having a cathode electrode and an anode electrode, the cathode electrode being in contact with the other side surface of the cathode conductive pad, the anode electrode being connected to the anode wire through at least one electric wire passing through the opening; a diffuser configured to diffuse a light beam output from the light source; and a second frame configured to support the diffuser so that the diffuser is spaced from the light source by a predetermined distance.

The diffuser may be attached to the second frame and the first frame and the second frame may be integrated with each other.

The at least one electric wire may be disposed to extend across a part of the first frame.

The cathode conductive pad may be adhered to the cathode wire through a conductive epoxy or a Surface Mount Technology (SMT) process, and the at least one electric wire may be connected to the anode wire by wire bonding.

The conductive pad may have an area wider than that of the cathode electrode of the light source, and the cathode wire may have an area wider than that of the conductive pad.

The light source may include a Vertical-Cavity Surface-Emitting Laser (VCSEL).

The beam projector module may further include: a light reception part configured to sense a reflected light beam reflected by the diffuser among light beams output from the light source; and a processor configured to block supply of power to the cathode wire or the anode wire when the intensity of the reflected light beam, measured in the light reception part, has a value lower than a reference value.

The processor may use the reflected light beam sensed by the light reception part to periodically feed back a change in the position of the diffuser to an external device or to recognize a change in the position of the diffuser and determine whether a laser included in the light source malfunctions.

A collimator lens or a filter lens may be disposed between the light source and the diffuser.

In accordance with another aspect of the present disclosure, there is provided a beam projector module including: a cathode conductive pad that is made of a conductive material or coated with a conductive material and has one side surface, a part or the entirety of which is in contact with a cathode wire on a Printed Circuit Board (PCB) for supplying power; a light source having a cathode electrode and an anode electrode, the cathode electrode being in contact with the other side surface of the conductive pad, the anode electrode being connected to an anode wire of the PCB through at least one electric wire; a diffuser configured to diffuse a light beam output from the light source; and a frame, which is made of a non-conductive material, surrounds the light source, and supports the diffuser so that the diffuser is spaced from the light source by a predetermined distance.

A substrate, on which the cathode conductive pad is formed, may be made of aluminum or an aluminum alloy.

The cathode conductive pad may be adhered to an inside of a region of the cathode wire through a conductive adhesive agent or a Surface Mount Technology (SMT) process, the cathode electrode of the light source may be adhered to the cathode conductive pad through a conductive adhesive agent, an SMT process, or eutectic bonding, a part or the entirety of the anode wire may be exposed, and the at least one electric wire may be wire-bonded to the exposed part of the anode wire.

The beam projector module includes a transverse bar part coupled to the frame, wherein the transverse bar part may be disposed between the electric wire and the PCB and may cut off the electric wire at the time of occurrence of a vibration or an external shock.

The beam projector module may further include: a light reception part; and a processor, wherein the light reception part may sense a reflected light beam reflected by the diffuser among light beams output from the light source; and the processor may block supply of power to the cathode wire or the anode wire when the intensity of the reflected light beam, measured in the light reception part, has a value lower than a reference value, and may give feedback in relation to malfunction of the laser or the VCSEL.

As described above, according to the present disclosure, the beam projector module can provide an eye-safety function, and since one of anode/cathode conductive pads is applied to a substrate and the remaining conductive pads for power supply are directly connected to a PCB, the beam projector module can have a reduced manufacturing cost and reduce power loss

BRIEF DESCRIPTION OF THE DRAWINGS

The above and other objects, features and advantages of the present disclosure will be more apparent from the following detailed description taken in conjunction with the accompanying drawings, in which.

DETAILED DESCRIPTION OF THE EXEMPLARY EMBODIMENTS

Hereinafter, embodiments of the present disclosure will be described in detail with reference to the accompanying drawings. In adding reference numerals to elements in each drawing, the same elements will be designated by the same reference numerals, if possible, although they are shown in different drawings. Further, in the following description made in the present disclosure, a detailed description of known functions and configurations incorporated herein will be omitted when it is determined that the description may make the subject matter of the present disclosure rather unclear.

In addition, terms, such as first, second, A, B, (a), (b) or the like may be used herein when describing components of the present disclosure. These terms are merely used to distinguish one structural element from other structural elements, and a property, an order, a sequence and the like of a corresponding structural element are not limited by the term. It should be noted that if it is described in the specification that one component is "connected," "coupled" or "joined" to another component, a third component may be "connected," "coupled," and "joined" between the first and second components, although the first component may be directly connected, coupled or joined to the second component.

A beam projector module according to embodiments described below can provide an eye-safety function in relation to a safety problem caused by detachment of a diffuser due to external shocks. The beam projector module according to embodiments described below is directly connected to a power supply part of a Printed Circuit Board (PCB) and thus can reduce electrical resistance and implement consumption of low power required for a portable device such as a mobile phone, and can also increase light efficiency.

In addition, the beam projector module according to embodiments described below can implement various advantageous functions. Those advantageous functions can be easily identified by a person skilled in the art and a detail description thereof will be made later or omitted.

Figure 1:
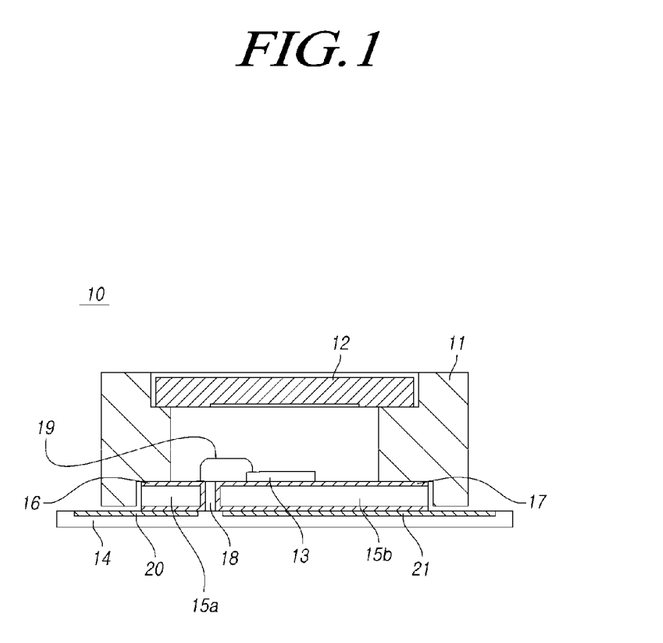
FIG. 1 is a cross-sectional view showing the configuration of an example of a beam projector module.

FIG. 1 is a cross-sectional view showing the configuration of an example of a beam projector module.

Referring to FIG. 1, a beam projector module 10 may have a structure in which an anode conductive pad 16 and a cathode conductive pad 17 are arranged on a Printed Circuit Board (PCB) 14, a light source 13 is disposed on the cathode conductive pad 17, and a frame 11 for supporting a diffuser 12 is disposed on the anode conductive pad 16 and the cathode conductive pad 17.

The anode conductive pad 16 may be formed on one side surface or all side surfaces of a first substrate 15a and the cathode conductive pad 17 may be formed on one side surface or all side surfaces of a second substrate 15b.

An anode wire 20 and a cathode wire 21 may be formed on the PCB 14. The anode wire 20 may supply power to the anode conductive pad 16 while being electrically connected to the anode conductive pad 16 and the cathode wire 21 may supply power to the cathode conductive pad 17 while being electrically connected to the cathode conductive pad 17.

The cathode conductive pad 17 may be bonded to a cathode electrode disposed on the bottom surface of the light source 13 and the anode conductive pad 16 may be electrically connected to an anode electrode exposed from an upper surface of the light source 13 through an electric wire 19. Power is supplied to the light source 13 by such bonding, and thus the light source 13 can output a light beam.

In this structure, a light beam having been output from the light source 13 is diffused by the diffuser 12, and the diffused light beam has a reduced intensity per unit area and thus can satisfy an eye-safety reference.

Meanwhile, the diffuser 12 and the light source 13 are coupled to the PCB 14 and to the conductive pads 16 and 17 through different paths. In a state in which the light source 13 is attached to the cathode conductive pad 17, the diffuser 12 may be detached from the frame 11 or the frame 11 including the diffuser 12 may be detached from the PCB 14 or from the conductive pads 16 and 17.

In detail, the diffuser 12 is coupled to the PCB 14 through the frame 11 and a substrate 15 including the anode conductive pad 16/the cathode conductive pad 17, and the light source 13 is coupled to the PCB 14 through the cathode conductive pad 17. In this coupling structure, when the frame 11 is detached from the PCB 14 or the conductive pads 16 and 17 of the substrate 15, the diffuser 12 may be detached from the PCB 14 or the conductive pads 16 and 17 together with the frame 11 but the light source 13 may be continuously connected to the PCB 14 or the conductive pads 16 and 17.

The conductive pads 16 and 17, which may be coated on one side surface of the substrate or on a predetermined area of all side surfaces thereof using a connection structure 18, may be bonded to the anode wire and the cathode wire on the PCB 14 and to the cathode electrode of the light source 13, by use of a method which takes advantage of melting point between homogeneous materials, such as in a eutectic having a low electrical resistance and a high coupling force, a Surface Mount Technology (SMT), a conductive epoxy, etc. On the contrary, the frame 11 and the diffuser 12 are made of respective non-conductive materials, and form a heterogeneous bond therebetween only in one section of an edge thereof and thus have a weak bonding force. Therefore, the frame 11 and the diffuser 12 are likely to escape or be detached when stress, such as a vibration or an external shock, occurs.

When this state is reached, the light source 13 continuously outputs a high-output light beam. However, since the diffuser 12 is not positioned on an output path of the light beam, the high-output light beam may be directly projected on a human body.

Meanwhile, in the structure illustrated in FIG. 1, the anode electrode of the light source 13 is electrically connected to the anode conductive pad 16 through a connection structure 18 and the anode conductive pad 16 is electrically reconnected to the anode wire 20 positioned on the PCB 14. Thus, a voltage necessary for emitting light can be supplied to the anode electrode of the light source 13. Further, the cathode electrode of the light source 13 can also be electrically connected to the cathode conductive pad 17 through the cathode wire 21 on the PCB 14.

However, in this electrical connection structure, the anode conductive pad 16 on the substrate 15 is positioned on a path through which power flows and thus may cause power loss due to resistance in the anode conductive pad 16.

The structure illustrated in FIG. 1 is also at a disadvantage in terms of manufacturing costs. It is necessary to implement an insulation layer for distinguishing between the anode conductive pad 16 and the cathode conductive pad 17. Therefore, the two pads may be manufactured according to a process of inserting the connection structure 18 between the substrates 15 to position the anode conductive pad 16 at one side of the connection structure 18 and to position the cathode conductive pad 17 at the other side thereof. In the above process, two substrates 15 should be used to form an insulation layer or an additional connection structure 18 should be used and have local conductive coating formed thereon, thus increasing component costs, process costs, and management costs.

Figure 2:
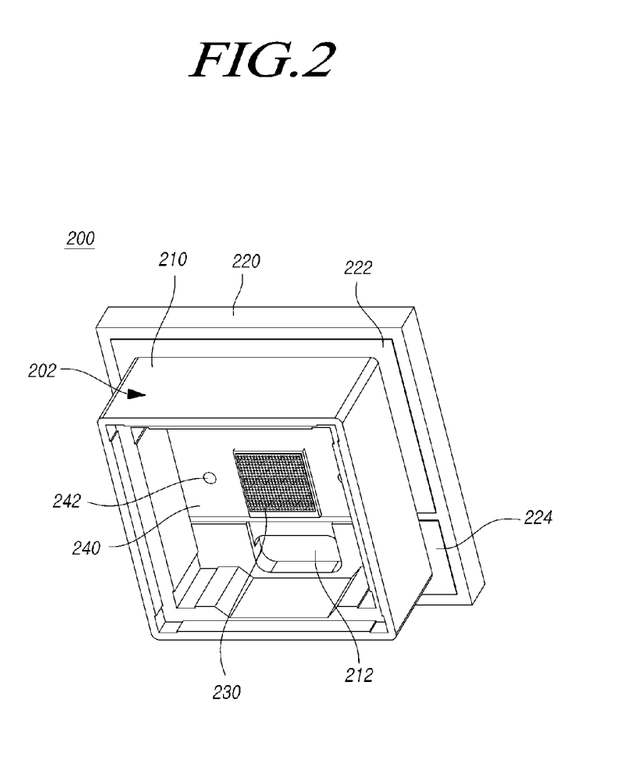
FIG. 2 is an upper perspective view of an element-on-PCB of a beam projector module according to one embodiment.
Figure 3:
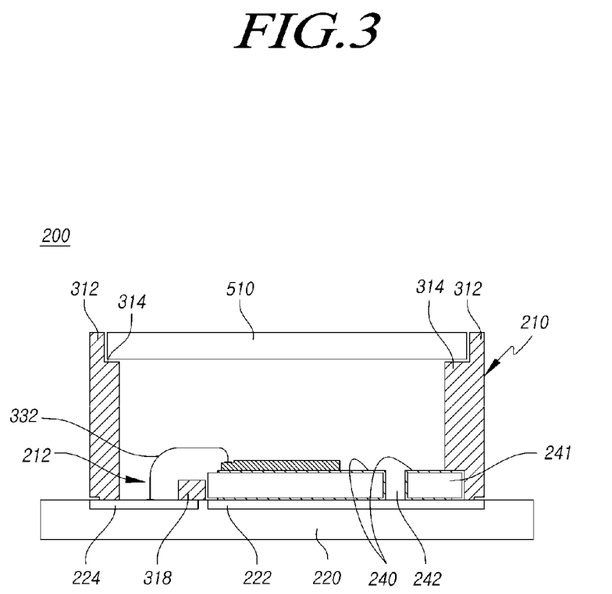
FIG. 3 is a cross-sectional view of the beam projector module according to one embodiment.
Figure 4:
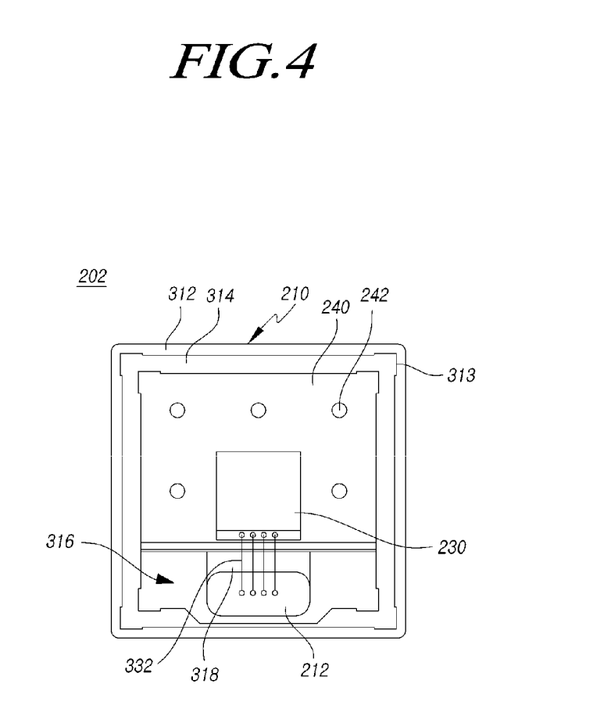
FIG. 4 is a front view of the beam projector module according to one embodiment.
Figure 5:
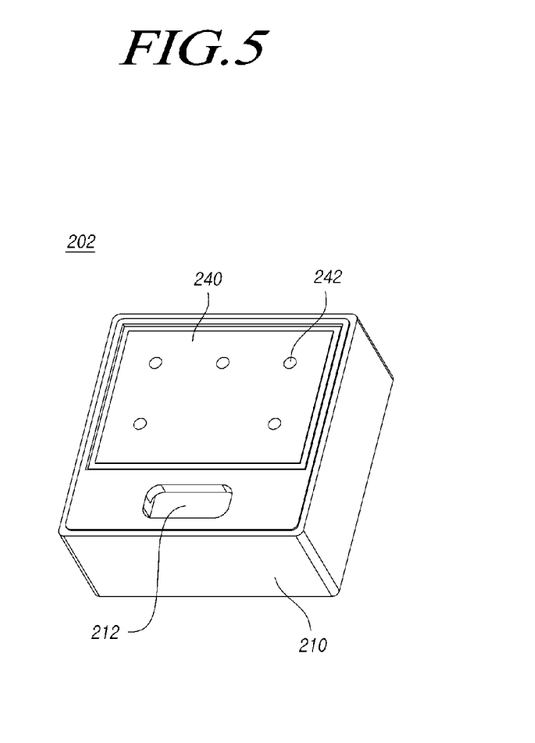
FIG. 5 is a lower perspective view of the beam projector module according to one embodiment.

FIG. 2 is an upper perspective view of an element-on-PCB of a beam projector module according to one embodiment. FIG. 3 is a cross-sectional view of the beam projector module according to one embodiment. FIG. 4 is a front view of the beam projector module according to one embodiment. FIG. 5 is a lower perspective view of the beam projector module according to one embodiment.

Referring to FIGS. 2 to 5, a beam projector module 200 implemented on a PCB 220 may include an element-on-PCB 202, which is arranged on the PCB 220. The PCB 220 and the element-on-PCB 202 may be separately manufactured and then coupled to each other. Further, the element-on-PCB 202 may be distributed as a separate product and thus itself may be referred to as a beam projector module. However, for convenience of description, the beam projector module 200 and the element-on-PCB 202 will be described as distinguished from each other.

A cathode wire 222 and an anode wire 224 may be positioned on the PCB 220. A cathode voltage may be supplied to the cathode wire 222 and an anode voltage may be supplied to the anode wire 224. The cathode voltage may be identical to, for example, a ground voltage. Further, the anode voltage may be a particular voltage necessary for driving a light source 230. The light source 230 may have a cathode electrode and an anode electrode formed therein. The cathode voltage supplied to the cathode wire 222 may be transferred to the cathode electrode of the light source 230, and the anode voltage supplied to the anode wire 224 may be transferred to the anode electrode of the light source 230.

The element-on-PCB 202, which is arranged on the PCB 220, may include a frame 210, the light source 230, a cathode conductive pad 240, a substrate 241, a diffuser 510 and the like.

The light source 230 may include a laser, for example, a Vertical-Cavity Surface-Emitting Laser (VCSEL). The diffuser 510 may diffuse a light beam output from the light source 230. A light beam, which has passed through the diffuser 510, may satisfy an eye-safety reference but a light beam, which has not passed through the diffuser 510, may have intensity stronger than the eye-safety reference.

The cathode conductive pad 240 may be formed on one side surface or on a predetermined area of all side surfaces of the substrate 241 by coating or may be made of a conductive material. A part or the entirety of one side surface of the cathode conductive pad 240 may be in contact with the cathode wire 222. Further, the other side surface of the conductive pad 240 may be in contact with the light source 230.

Alternatively, the cathode conductive pad 240 may be formed on the substrate 241 through plating, deposition, or lithography.

Provided that a light beam is output upward, the cathode conductive pad 240 may be positioned on the cathode wire 222 of the PCB 220 and the light source 230 may be positioned on the cathode conductive pad 240.

The cathode conductive pad 240 may be made of a conductive material having low electrical resistance and a material having good thermal conductivity. Further, the cathode conductive pad 240 may be coupled to the cathode wire 222 of the PCB 220 by use of a method which takes advantage of melting point between homogeneous materials, such as in a eutectic having a low electrical resistance and a high coupling force, a Surface Mount Technology (SMT), a conductive epoxy, etc.

The cathode conductive pad 240 may electrically connect the cathode wire 222 and the cathode electrode of the light source 230, may form a support plate on which the light source 230 can be stably placed, and may radiate heat generated from the light source 230.

In this regard, the cathode wire 222 has an area wider than that of the cathode conductive pad 240 and thus the cathode conductive pad 240 can be positioned inside a region at which the cathode wire 222 is positioned. Further, the cathode conductive pad 240 has an area wider than that of the cathode electrode of the light source 230. Thus, the cathode electrode of the light source 230 can be positioned inside an upper surface of the cathode conductive pad 240.

In order to increase adhesion force and electrical conductivity, the cathode conductive pad 240 may be adhered to the cathode wire 222 by a conductive epoxy (for example, Ag-epoxy), which is a conductive adhesive agent. Further, the cathode electrode of the light source 230 may be also adhered to the cathode conductive pad 240 by a conductive epoxy (for example, Ag-epoxy), which is a conductive adhesive agent, an SMT, a eutectic process or the like.

The cathode conductive pad 240 may be implemented by coating, plating, or depositing a low electrical resistance metal on one side surface or all side surfaces of the substrate 241. The cathode conductive pad 240 may be manufactured by only a cutting process for a single metal plate. Therefore, a process of inserting a connection structure of an insulation layer between two aluminum plates as in FIG. 1 (see 18 in FIG. 1) becomes unnecessary.

One or a plurality of holes (242) may be formed through the cathode conductive pad 240.

The frame 210 may be made of a non-conductive material and may surround the light source 230 to a side surface located in a direction in which a light beam is emitted. The frame 210 may be made of a material having good formability or a good processing property, such as plastic or aluminum, and may have non-conductivity due to properties of a material or due to an insulation material surrounding the material.

Further, the frame 210 may support the diffuser 510 so that the diffuser 510, positioned on an emission path of a light beam, is spaced from the light source 230 by a predetermined distance.

The frame 210 may be divided into a first frame 316, a second frame 314, and a third frame 312.

The first frame 316 may be disposed parallel to the PCB 220 while one side surface (i.e. wide surface) of the first frame 316 is in contact with the PCB 220. The first frame 316 may be in contact with the PCB 220 at a region at which the conductive pad 240 is not disposed. An opening 212 may be formed on the anode wire 224 to allow a part or the entirety of the anode wire 224 to be exposed therethrough.

The anode electrode of the light source 230 may be connected to the exposed part of the anode wire 224 by using an electric wire 332 passing through the opening 212.

The electric wire 332 may be single or plural and may be connected to the anode wire 224 on the PCB 220 by wire bonding. When the anode electrode is compared with the cathode electrode, the cathode electrode is fixed to the PCB 220 through surface adhesion while the anode electrode is directly connected to the PCB 220 through point adhesion using the electric wire 332 and thus has a connection relationship therewith in which adhesion strength is relatively weak. The cathode electrode of the light source 230 may be bonded to the conductive pad 240 by using a minimum melting point bonding method between alloy metals on bonding surfaces, such as a conductive epoxy or eutectic bonding.

Meanwhile, when the opening 212 is positioned inside the first frame 316, the electric wire 332 may be disposed to extend across a part of the first frame 316. As an example, in view from the above, the first frame 316 may include a structure in which a transverse bar part 318 is positioned between the opening 212 and the light source 230. The transverse bar part 318 may be formed as a part of the first frame 316 or as a separate structure and may be positioned between the electric wire 332 and the PCB 220. Further, the electric wire 332 may be disposed to extend across the transverse bar part 318.

When the first frame 316 is detached from the PCB 220 due to a vibration or an external force, the transverse bar part 318 may be detached together therewith. In this case, since the electric wire 332 is disposed to extend across the transverse bar part 318, the detached transverse bar part 318 applies a force to the electric wire 332 to allow the electric wire 332 to be cut off or allow the electric wire 332 to be disconnected from the anode wire 224. When the electric wire 332 is cut off, an anode voltage is not supplied to the anode electrode of the light source 230, thus causing the light source 230 to stop emitting light.

Meanwhile, an adhesion force of wire bonding can be adjusted through adjustable process conditions, such as the number of wires, a bonding pressure, a bonding temperature, and a bonding time.

The height of the transverse bar part 318 (a height in a direction in which a light beam is emitted) may be lower than that of the cathode conductive pad 240. Further, the height of the first frame 316, from which the transverse bar part 318 is excluded, may be identical to that of the cathode conductive pad 240 or may be different therefrom within a predetermined range.

Meanwhile, the transverse bar part 318 may be stepped to be lower than other portions of the first frame 316. According to this structure, the electric wire 332 may have a natural inclination in the anode electrode of the light source 230 and may be connected to the anode wire 224.

The transverse bar part 318 may be omitted according to embodiments. In this case, the entire first frame 316 in addition to the transverse bar part 318 may be omitted. Even when the first frame 316 is included in the embodiments, the first frame 316 may be formed so that the opening 212 is continuous with the cathode conductive pad 240—so that another element is not inserted between the opening 212 and the cathode conductive pad 240.

The second frame 314 is positioned to stand up in a direction perpendicular to the PCB 220, and may support the diffuser 510 so that the diffuser 510 is spaced from the light source 230 by a predetermined distance.

The second frame 314 has the bottom surface, a part of which may be in contact with the PCB 220 and another part of which may be in contact with the conductive pad 240. The diffuser 510 may be attached to an upper surface of the second frame 314.

The third frame 312 forms the outermost periphery of the frame 210 and may laterally support the diffuser 510. The third frame 312 may be higher than the second frame 314 by the thickness of the diffuser 510. Due to such a height difference, the second frame 314 may support the lower surface of the diffuser 510 and the third frame 312 may support the side surface (the side) of the diffuser 510.

In view from the above of the third frame 312, a recession 313 may be formed on an inner line of the third frame 312. Further, the recession 313 may cause a minute gap to be formed between the diffuser 510 and the third frame 312. Such a gap makes a process of coupling the diffuser 510 be easily carried out.

The recession 313 may be formed at four corners of the third frame 312 formed as a quadrangular shape.

The first frame 316, the second frame 314, and the third frame 312 may be integrally formed by single injection. Thus, when the frame 210 is detached, the diffuser 510 and the transverse bar part 318 are detached together. When the diffuser 510 is detached, continuously outputting a high-output light beam by the light source 230 may cause a problem. According to one embodiment, the transverse bar part 318 can cut off a connection between the electric wire 332 and the anode wire 224, thereby preventing the light source 230 from emitting a light beam.

A beam projector module according to one embodiment may be connected to an anode electrode of a light source and an anode wire of a PCB by using one or a plurality of electric wires. When a drag force larger than a bonding force of an electric wire occurs due to continuous inner vibration stress or an external shock, a diffuser and a frame are detached and concurrently the electric wire is cut off to block power supply to the beam projector module, thereby enabling an eye safety-related problem to be solved.

Further, in one embodiment, the anode conductive pad illustrated in FIG. 1 is omitted, thus reducing problems, such as an increase in manufacturing costs and power loss due to the anode conductive pad. The anode electrode of the light source 230 is directly connected to the anode wire 224 through the electric wire 332, thus enabling power loss and manufacturing costs to be reduced.

Figure 6:
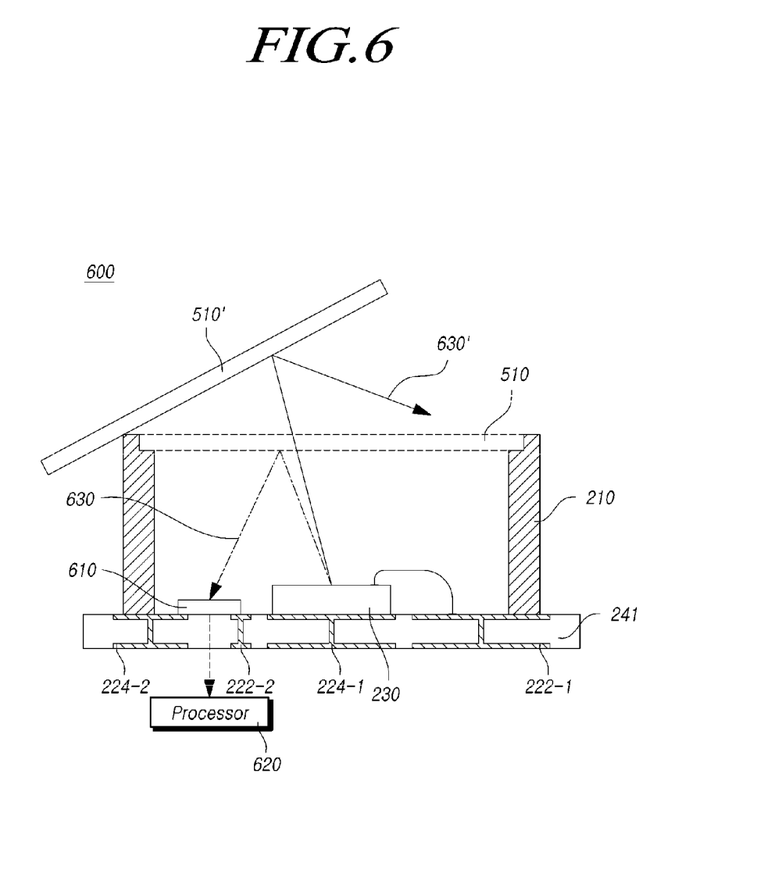
FIG. 6 is a view of a beam projector module according to another embodiment.

FIG. 6 is a cross-sectional view of a beam projector module according to another embodiment.

Referring to FIG. 6, a beam projector module 600 may include a frame 210, a substrate 241, at least one anode conductive pad 224-1 or 224-2, at least one cathode conductive pad 222-1 or 222-2, a light source 230, and a diffuser 510, and may further include a light reception part 610 and a processor 620.

The diffuser 510 may diffuse a light beam output from the light source 230 to carry out a function of reducing the intensity of the light beam.

The light reception part 610 and the processor 620 may determine whether the diffuser 510 is positioned at an appropriate location, and, when it is determined that the diffuser 510 is positioned at an inappropriate location, may block supply of power to the light source 230 to prevent an unsafe light beam from being output to a human body.

The light reception part 610 may sense a reflected light beam 630 which is reflected by the diffuser 510 among light beams output from the light source 230. When the diffuser 510 is positioned at an appropriate location, the light reception part 610 can receive a reflected light beam 630 having light intensity or light amount equal to or more than a reference value.

However, a reflected light beam 630' generated by a diffuser 510' positioned at an inappropriate location is output in a direction different from the light reception part 610. Therefore, the light reception part 610 may receive a light beam having light intensity or light amount less than a reference value or may not receive the reflected light beam 630'.

According to this principle, when the intensity or amount of a light beam, measured in the light reception part 610, is less than a reference value, the processor 620 may block supply of power to a cathode wire or an anode wire disposed on the substrate 241, thereby preventing the light source 230 from outputting a light beam.

Further, the diffuser 510 may be basically attached to the frame 210 which is positioned to stand up on the substrate 241. When an external force is applied to the diffuser 510, the diffuser 510 may be separated from the frame 210 or may be moved to an inappropriate location, thus causing horizontal and vertical assembling angles to be changed. This may cause not only an eye-safety problem but also a problem of degradation in optical performance, such as the uniformity and intensity of a final beam, which has passed through the diffuser, the sharpness of a pattern, a contrast, or the like. Thus, it is necessary to continuously give feedback to a system through continuously identifying an assembled state of the diffuser. The present disclosure enables the system to continuously identify eye-safety and the state of the diffuser and to identify whether a laser malfunctions.

The another embodiment described with reference to FIG. 6 may carried out in combination with the one embodiment described with reference to FIGS. 2 to 5 or may be carried out independently.

According to the embodiments described above, the beam projector module can provide an eye-safety function, can give feedback of performance variation according to the assembled state of the sensitive diffuser, can identify whether a laser malfunctions, can have a reduced manufacturing cost, and can reduce power loss.

In addition, since terms, such as "including," "comprising," and "having" mean that one or more corresponding components may exist unless they are specifically described to the contrary, it shall be construed that one or more other components can be included. All the terms that are technical, scientific or otherwise agree with the meanings as understood by a person skilled in the art unless defined to the contrary. Common terms as found in dictionaries should be interpreted in the context of the related technical writings not too ideally or impractically unless the present disclosure expressly defines them so.

Although a preferred embodiment of the present disclosure has been described for illustrative purposes, those skilled in the art will appreciate that various modifications, additions and substitutions are possible, without departing from the scope and spirit of the disclosure as made in the accompanying claims. Therefore, the embodiments disclosed in the present disclosure are intended to illustrate the scope of the technical idea of the present disclosure, and the scope of the present disclosure is not limited by the embodiment. The scope of the present disclosure shall be construed on the basis of the accompanying claims in such a manner that all of the technical ideas included within the scope equivalent to the claims belong to the present disclosure.

What is claimed is:

1. A beam projector module comprising:
    a cathode conductive pad that is made of a conductive material or coated with a conductive material and has one side surface, a part or the entirety of which is in contact with a cathode wire on a Printed Circuit Board (PCB) for supplying power;
    a first frame that is made of a non-conductive material and has one side surface which is in contact with the PCB, an opening being formed on an anode wire of the PCB;
    a light source having a cathode electrode and an anode electrode, the cathode electrode being in contact with the other side surface of the cathode conductive pad, the anode electrode being connected to the anode wire through at least one electric wire passing through the opening;
    a diffuser configured to diffuse a light beam output from the light source; and
    a second frame configured to support the diffuser so that the diffuser is spaced from the light source by a predetermined distance.

2. The beam projector module of claim 1, wherein the diffuser is attached to the second frame and the first frame and the second frame are integrated with each other.

3. The beam projector module of claim 1, wherein the at least one electric wire is disposed to extend across a part of the first frame.

4. The beam projector module of claim 1, wherein the cathode conductive pad is adhered to the cathode wire through a conductive epoxy or a Surface Mount Technology (SMT) process, and the at least one electric wire is connected to the anode wire by wire bonding.

5. The beam projector module of claim 1, wherein the conductive pad has an area wider than that of the cathode electrode of the light source, and the cathode wire has an area wider than that of the conductive pad.

6. The beam projector module of claim 1, wherein the light source comprises a Vertical-Cavity Surface-Emitting Laser (VCSEL).

7. The beam projector module of claim 1, further comprising:
   a light reception part configured to sense a reflected light beam reflected by the diffuser among light beams output from the light source; and
   a processor configured to block supply of power to the cathode wire or the anode wire when the intensity of the reflected light beam, measured in the light reception part, has a value lower than a reference value.

8. The beam projector module of claim 7, wherein the processor uses the reflected light beam sensed by the light reception part to periodically feed back a change in the position of the diffuser to an external device or to recognize a change in the position of the diffuser and determine whether a laser included in the light source malfunctions.

9. A beam projector module comprising:
   a cathode conductive pad that is made of a conductive material or coated with a conductive material and has one side surface, a part or the entirety of which is in contact with a cathode wire on a Printed Circuit Board (PCB) for supplying power;
   a light source having a cathode electrode and an anode electrode, the cathode electrode being in contact with the other side surface of the conductive pad, the anode electrode being connected to an anode wire of the PCB through at least one electric wire;
   a diffuser configured to diffuse a light beam output from the light source;
   a frame, which is made of a non-conductive material, surrounds the light source, and supports the diffuser so that the diffuser is spaced from the light source by a predetermined distance; and
   a transverse bar part that is coupled to the frame, wherein the transverse bar part is disposed between the electric wire and the PCB and cuts off the electric wire at the time of occurrence of a vibration or an external shock.

10. The beam projector module of claim 9, wherein a substrate, on which the cathode conductive pad is formed, is made of aluminum or an aluminum alloy.

11. The beam projector module of claim 9, wherein the cathode conductive pad is adhered to an inside of a region of the cathode wire through a conductive adhesive agent or a Surface Mount Technology (SMT) process, the cathode electrode of the light source is adhered to the cathode conductive pad through a conductive adhesive agent, an SMT process, or eutectic bonding, a part or the entirety of the anode wire is exposed, and the at least one electric wire is wire-bonded to the exposed part of the anode wire.

* * * * *